US010943916B2

(12) United States Patent
Huo et al.

(10) Patent No.: US 10,943,916 B2
(45) Date of Patent: Mar. 9, 2021

(54) METHOD FOR MANUFACTURING THREE-DIMENSIONAL MEMORY STRUCTURE

(71) Applicant: Yangtze Memory Technologies Co., Ltd., Wuhan (CN)

(72) Inventors: Zongliang Huo, Wuhan (CN); Wenbin Zhou, Wuhan (CN); Lei Zhang, Wuhan (CN); Peng Yang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 4 days.

(21) Appl. No.: 16/149,149

(22) Filed: Oct. 2, 2018

(65) Prior Publication Data
US 2019/0157288 A1   May 23, 2019

Related U.S. Application Data

(63) Continuation of application No. PCT/CN2018/107031, filed on Sep. 21, 2018.

(30) Foreign Application Priority Data

Nov. 23, 2017 (CN) .......................... 201711184313.7

(51) Int. Cl.
| *H01L 27/11575* | (2017.01) |
| *H01L 27/11556* | (2017.01) |
| *H01L 27/11548* | (2017.01) |
| *H01L 21/762* | (2006.01) |
| *H01L 27/11582* | (2017.01) |
| *H01L 27/11573* | (2017.01) |
| *H01L 27/11529* | (2017.01) |

(52) U.S. Cl.
CPC .. *H01L 27/11575* (2013.01); *H01L 21/76224* (2013.01); *H01L 27/11529* (2013.01); *H01L 27/11548* (2013.01); *H01L 27/11556* (2013.01); *H01L 27/11573* (2013.01); *H01L 27/11582* (2013.01)

(58) Field of Classification Search
CPC ......... H01L 27/11575; H01L 21/76224; H01L 27/11529; H01L 27/11548; H01L 27/115556; H01L 27/11573; H01L 27/11582
USPC ......................................................... 257/506
See application file for complete search history.

(56) References Cited

U.S. PATENT DOCUMENTS

| 2007/0047371 | A1* | 3/2007 | Park | ...................... G11C 11/412 |
| | | | | 365/230.06 |
| 2010/0120214 | A1* | 5/2010 | Park | .................. H01L 27/11578 |
| | | | | 438/287 |
| 2010/0320528 | A1* | 12/2010 | Jeong | ..................... H01L 27/105 |
| | | | | 257/324 |
| 2011/0076819 | A1* | 3/2011 | Kim | .................. H01L 27/11551 |
| | | | | 438/279 |

(Continued)

FOREIGN PATENT DOCUMENTS

CN          102800676 A       11/2012

*Primary Examiner* — Dzung Tran
(74) *Attorney, Agent, or Firm* — Winston Hsu

(57) ABSTRACT

A method for manufacturing a three-dimensional (3D) memory structure and a 3D memory structure are disclosed. A recess is formed on a substrate, a 3D memory component is formed with a bottom in the recess, and then, a peripheral circuit is formed on the substrate outside the recess.

3 Claims, 8 Drawing Sheets

(56) References Cited

U.S. PATENT DOCUMENTS

| | | | |
|---|---|---|---|
| 2011/0169071 A1* | 7/2011 | Uenaka | H01L 27/105 257/326 |
| 2012/0299082 A1 | 11/2012 | Park | |
| 2013/0264631 A1* | 10/2013 | Alsmeier | H01L 21/764 257/324 |
| 2014/0061849 A1 | 3/2014 | Tanzawa | |
| 2016/0064281 A1* | 3/2016 | Izumi | H01L 21/76816 257/315 |

* cited by examiner

METHOD FOR MANUFACTURING THREE-DIMENSIONAL MEMORY STRUCTURE

CROSS REFERENCE TO RELATED APPLICATIONS

This application is a continuation of International Application No. PCT/CN 2018/107031 filed Sep. 21, 2018 which claims priority of Chinese Patent Application No. 201711184313.7 filed Nov. 23, 2017, the entire contents of which are incorporated herein by reference.

BACKGROUND OF THE INVENTION

1. Field of the Invention

The present invention relates to a method for manufacturing a three-dimensional (3D) memory structure, a 3D memory structure, a 3D memory device and an electronic apparatus.

2. Description of the Prior Art

Memory technology is continuously progressing with continuously growing demand for integration and storage capacity. When the size of two-dimensional planar memory is shrunk to more than ten nanometers level (such as 16 nm, 15 nm, or even 14 nm), each storage unit becomes very tiny, and only a few electrons can be stored in each storage unit, such that ability of each storage unit to control electrons becomes weak and crosstalk problem easily occurs. Hence, it's difficult and costly to reduce the size of the storage unit. For this reason, three-dimensional (3D) memory structure is developed, which is achieved by stacking the storage units based on the planar memory structure.

Core elements in the 3D memory structure are mainly composed of a memory component and a peripheral circuit that are formed on the same substrate. Refer to FIG. 1 which schematically illustrates a conventional 3D memory structure 1. Since the memory component 2 and the peripheral circuit 3 have different structure, especially they have greatly different thicknesses, they need to be fabricated separately. However, the memory component 2 and the peripheral circuit 3 are formed on the same substrate 4, so in the conventional technology, the peripheral circuit 3 is formed on the substrate 4 prior to the formation of the memory component 2. Since the formation of the memory component 2 needs lots of high-temperature processes, the electrical characteristic of the devices in the peripheral circuit is adversely affected by the high-temperature processes, thereby decreasing product yield.

As a result, there is a need for the manufacturing method of the 3D memory structure to effectively raise the electrical characteristic of the devices in the peripheral circuit and the product yield.

SUMMARY OF THE INVENTION

Embodiments of a method for manufacturing a three-dimensional (3D) memory structure, a 3D memory structure, a 3D memory device and an electronic apparatus are disclosed herein.

According to some embodiments of the present invention, a method for manufacturing a three-dimensional (3D) memory structure is disclosed. A recess is formed on a substrate, a 3D memory component is formed with a bottom located in the recess, and then, a peripheral circuit is formed on the substrate outside the recess.

According to some embodiments of the present invention, a 3D memory structure includes a substrate, a 3D memory component, and a peripheral circuit. The substrate has a recess, the 3D memory component has a bottom that is disposed in the recess of the substrate, and the peripheral circuit is disposed on the substrate outside the recess.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
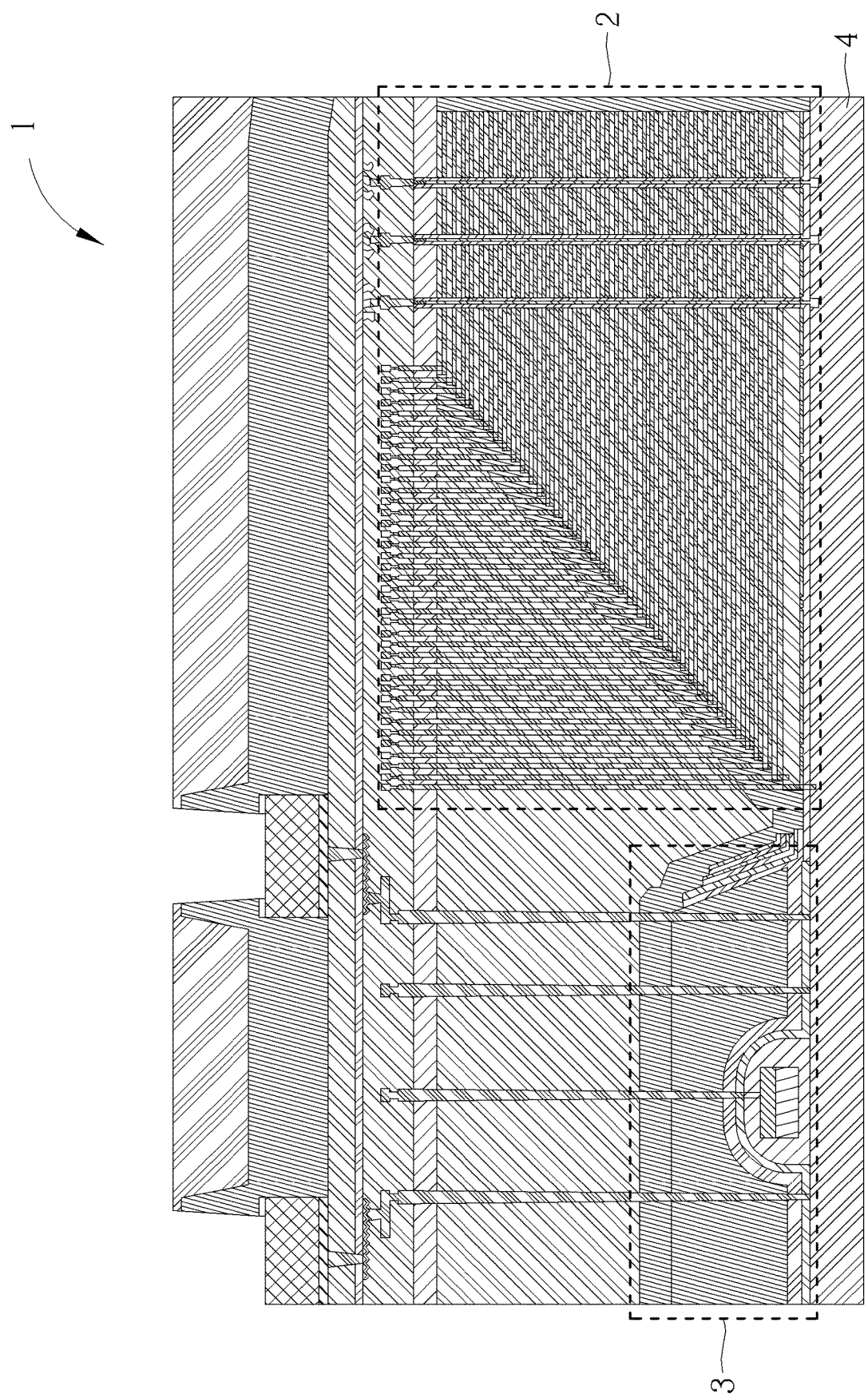
FIG. 1 schematically illustrates a conventional 3D memory structure.

Although specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that the present invention can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present invention should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials such as silicon, germanium, gallium arsenide, indium phosphide, etc. Alternatively, the substrate can be made from an electrically non-conductive material, such as a glass, a plastic, or a sapphire wafer.

As used throughout this application, the word "may" is used in a permissive sense (e.g., meaning having the potential to), rather than the mandatory sense (e.g., meaning must). The words "include," "including," and "includes" indicate open-ended relationships and therefore mean including, but not limited to. Similarly, the words "have," "having," and "has" also indicated open-ended relationships, and thus mean having, but not limited to. The terms "first," "second", "third," and so forth as used herein are meant as labels to distinguish among different elements and may not necessarily have an ordinal meaning according to their numerical designation.

Various embodiments in accordance with the present invention provide a method for manufacturing a three-dimensional (3D) memory structure, a 3D memory structure, a 3D memory device and an electronic apparatus and are described in connection with the drawings as described below.

Figure 2:
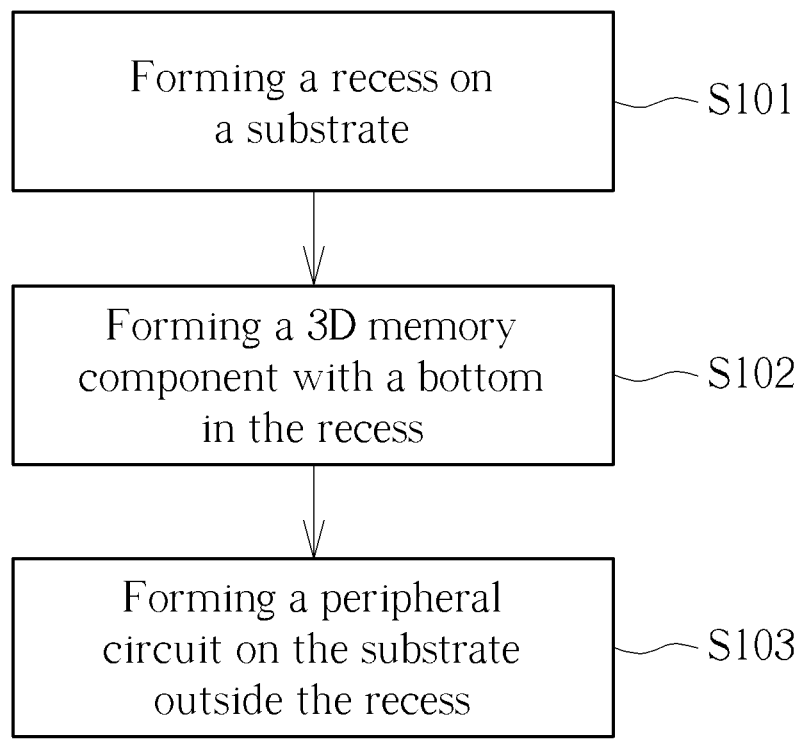
FIG. 2 illustrates a flowchart of an exemplary method for manufacturing a 3D memory structure according to some embodiments of the present invention.
Figure 6:
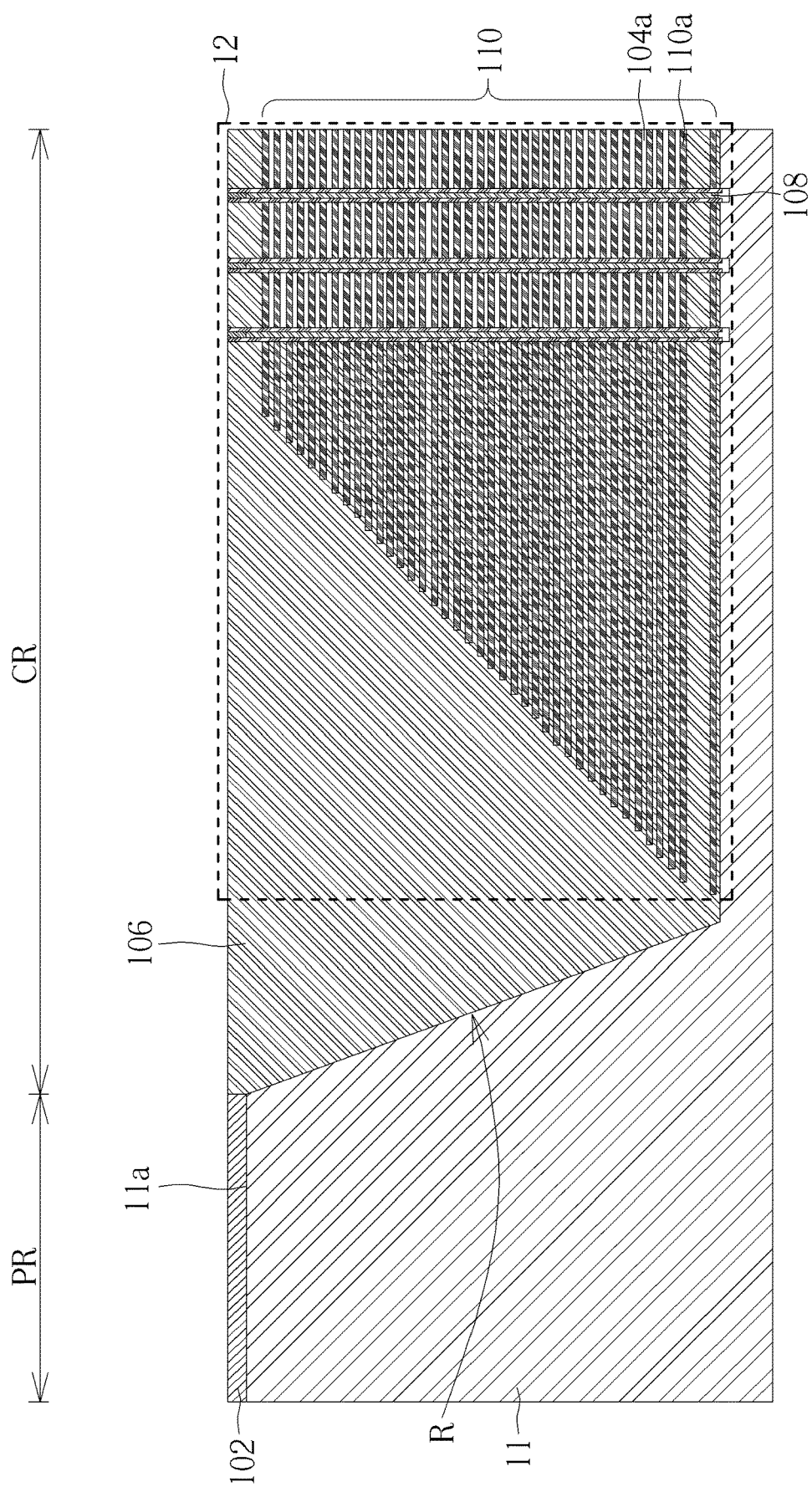
Figure 7:
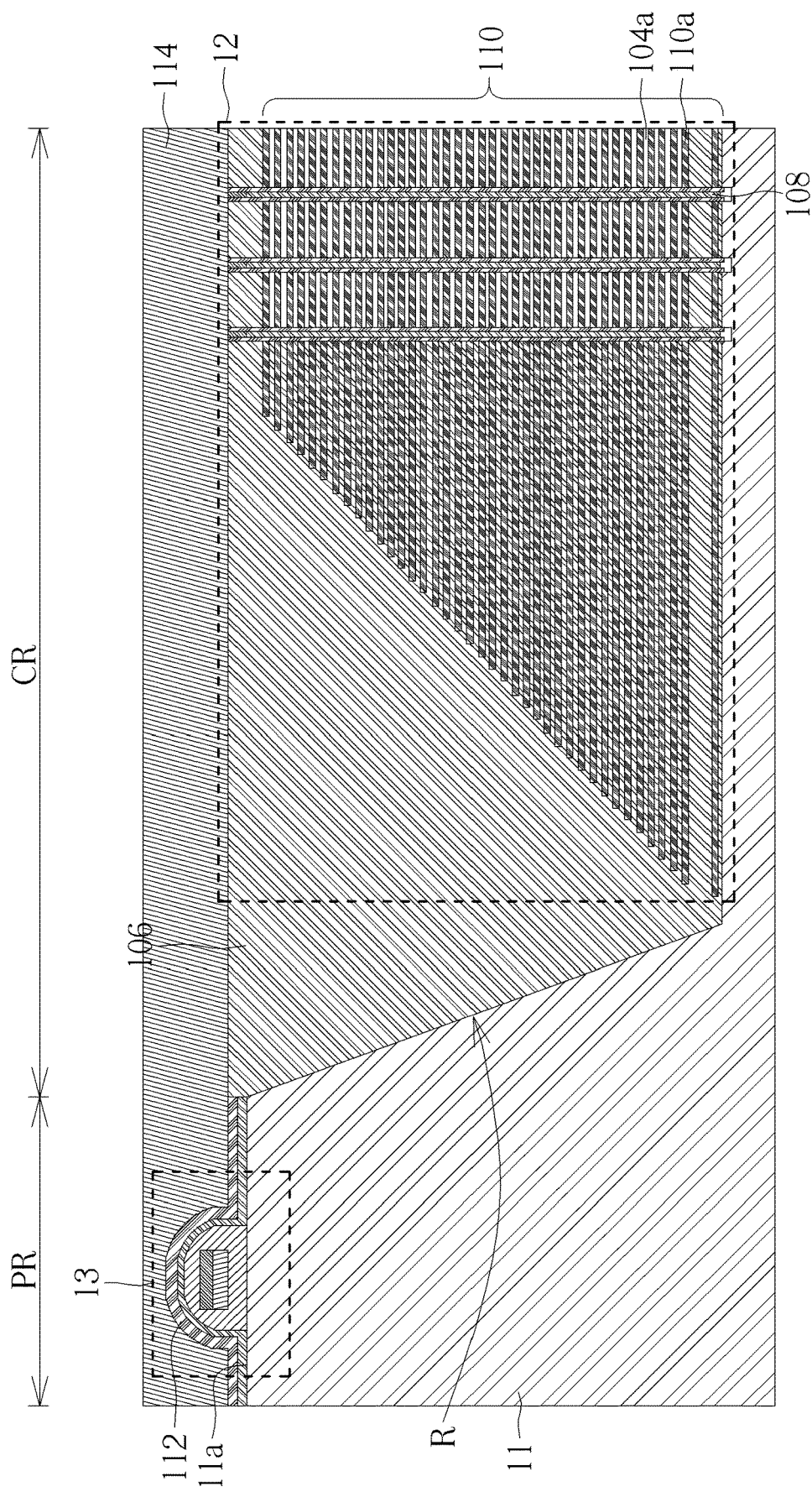
Figure 8:
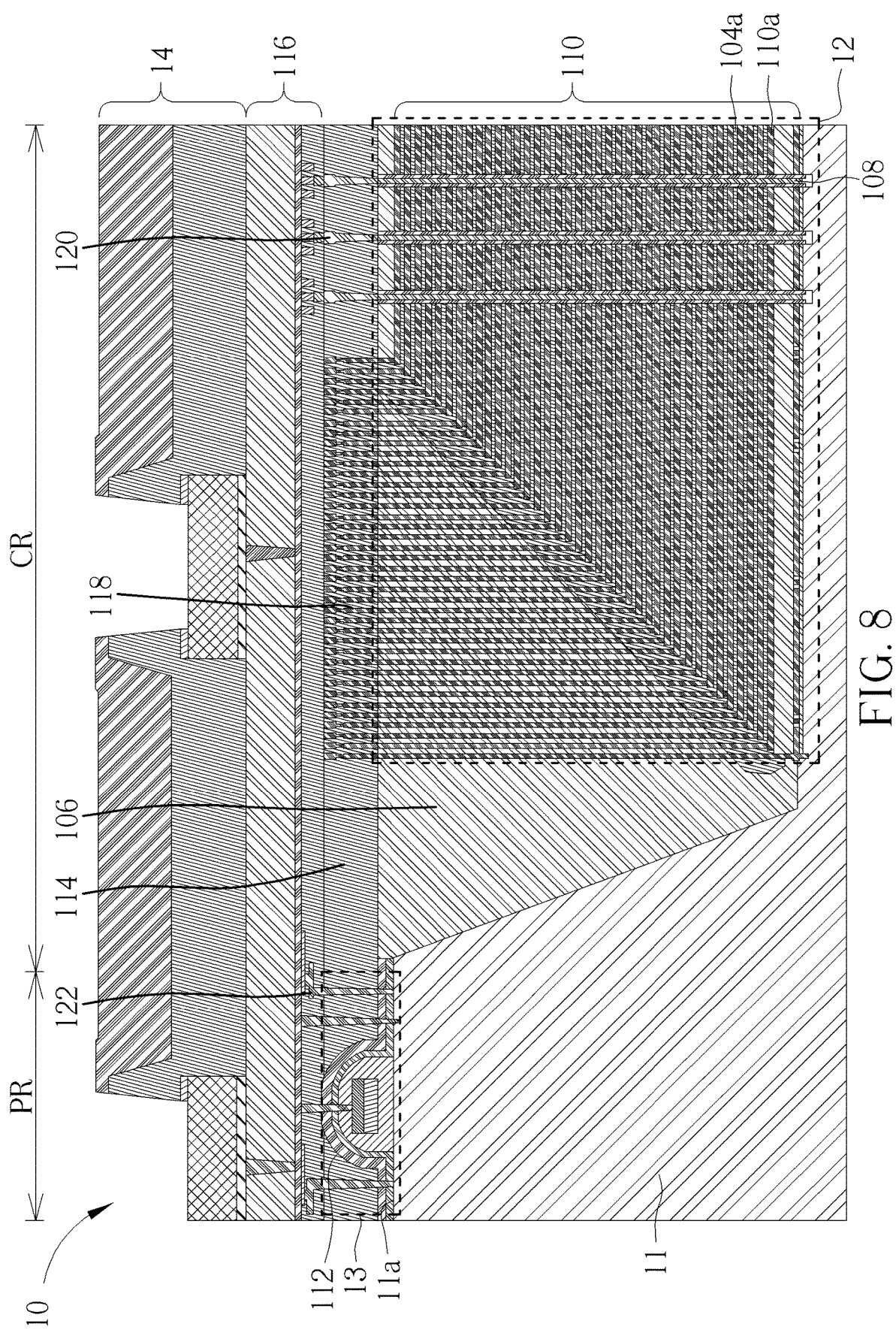

Refer to FIG. 2 to FIG. 8. FIG. 2 illustrates a flowchart of an exemplary method for manufacturing a 3D memory structure according to an embodiment of the present invention. FIGS. 3-8 schematically illustrate cross-sectional views of an exemplary 3D memory structure at certain fabricating steps of the method shown in FIG. 2, in which FIG. 8 schematically illustrates an exemplary 3D memory structure according to the embodiment of the present invention. It should be understood that the steps shown in the method are not exhaustive and that other steps can be performed as well before, after, or between any of the illustrated steps.

Figure 3:
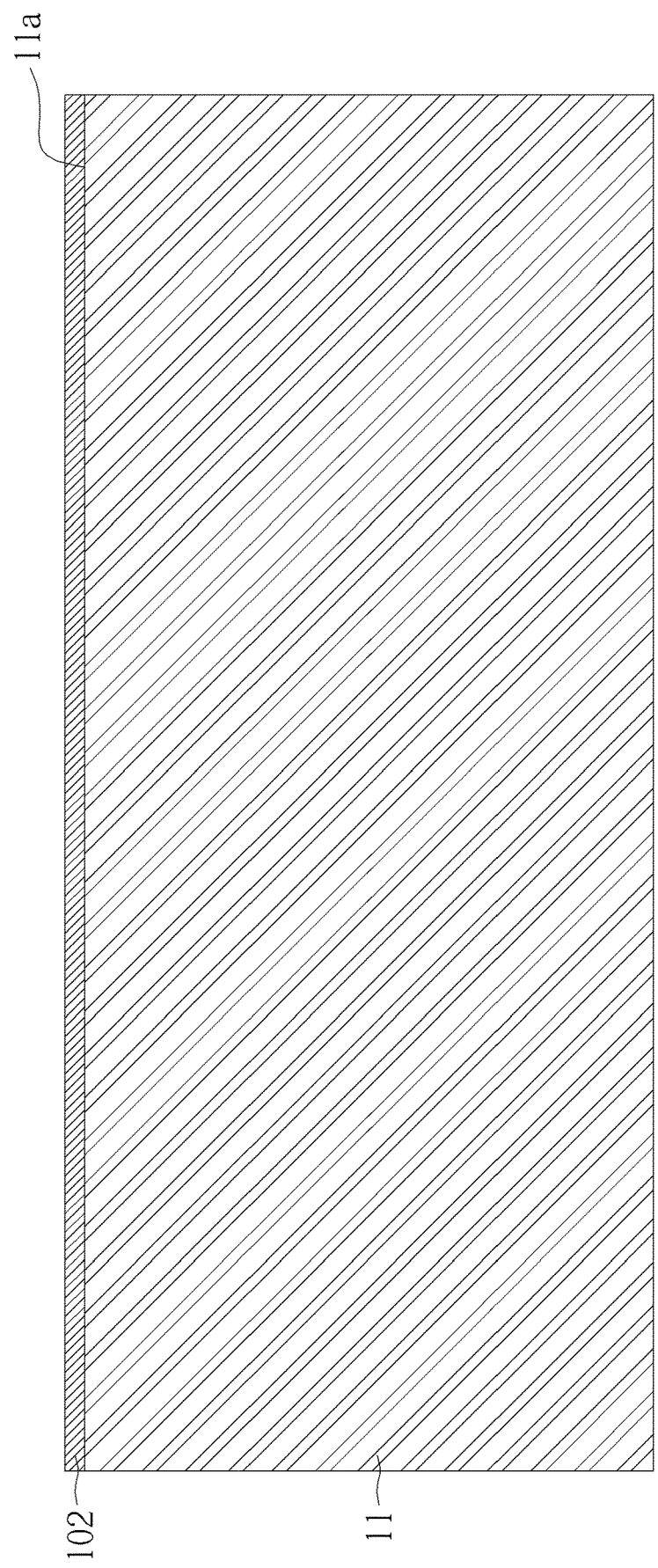
FIGS. 3-8 schematically illustrate cross-sectional views of an exemplary 3D memory structure at certain fabricating steps of the method shown in FIG. 2.
Figure 4:
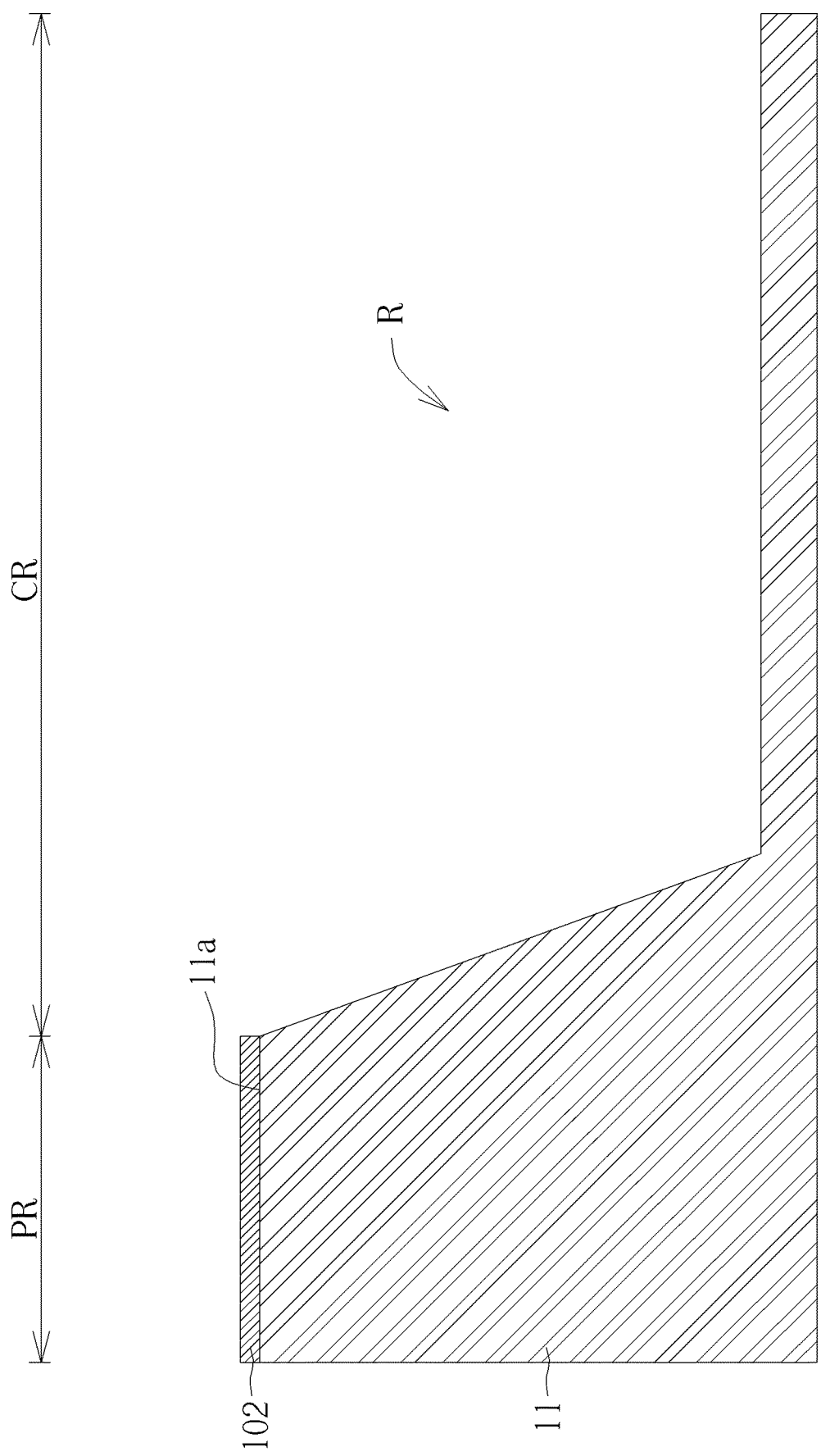

As shown in FIG. 2, the method for manufacturing the 3D memory structure 10 starts at step S101, in which a recess R is formed on a substrate 11. In some embodiments, as shown in FIG. 3, before forming the recess R, a mask layer 102 may be formed on a top surface 11a of the substrate 11. For example, the mask layer 102 may include silicon oxide and be formed by a thermal oxidation process. In some embodiments, the mask layer 102 may be formed by CVD, PVD or other suitable deposition process. After that, as shown in FIG. 4, the mask layer 102 may be etched to expose a part of the substrate 11 by a photolithography process. The remaining mask layer 102 is used as a mask to etch the top surface 11a of the exposed part of the substrate 11 by using an etching process, so as to form the recess R on the substrate 11. Hence, the top surface 11a of the substrate 11 has the recess R. The etching process may include a dry etching process or a wet etching process. In some embodiments, as shown in FIG. 4, the region of the substrate 11 with the recess R may serve as a core memory region CR for forming one or more memory components of the 3D memory structure, and the region of the substrate 11 outside the recess R may serve as a peripheral circuit region PR for forming one or more peripheral circuits of the 3D memory structure.

In some embodiments, the substrate 11 may include semiconductor material, such as monocrystalline silicon, polycrystalline silicon (polysilicon), bulk germanium (Ge), Si on insulator (SOI), Ge on insulator (GeOI), silicon germanium (SiGe), gallium nitride (GaN), gallium arsenide (GaAs), Indium phosphide (InP), silicon carbide (SiC), silicon and silicon germanium (Si/SiGe), silicon and germanium on insulator (SGOI) or other suitable semiconductor material, but not limited thereto. In the following description, the substrate 11 is a monocrystalline silicon substrate as an example.

As shown in FIG. 2 and FIG. 6, after step S101, the method proceeds to step S102, in which a 3D memory component 12 is formed with a bottom in the recess R of the substrate 11 (in the core memory region CR). In other words, at least the bottom of the 3D memory component 12 is disposed within the recess R of the substrate 11, such that the bottom of the 3D memory component 12 is lower than the top surface 11a of the substrate 11 outside the recess R. In some embodiments, the 3D memory component 12 may be fully disposed within in the recess R of the substrate 11, so the top of the 3D memory component 12 may be lower than the top surface 11a of the substrate 11. The 3D memory component 12 may be any kind of 3D memory components, for example 3D NAND flash memory component, such as Bit Cost Scalable (BiCS), Terabit Cell Array Transistor (TCAT), Stacked Memory Array Transistor (SMArT), Vertical Stacked Array Transistor (VSAT), 3D NOR flash memory component, DRAM, or 3D Xpoint flash memory component, but not limited thereto. Thus, in step S102, the method for forming the 3D memory component 12 may adopt any one of methods for forming 3D memory components, for example method for forming 3D NAND flash memory component, such as BiCS, TCAT, SMArT, VSAT, method for forming 3D NOR flash memory component, method for forming DRAM, or method for forming 3D Xpoint flash memory component, but not limited thereto.

Figure 5:
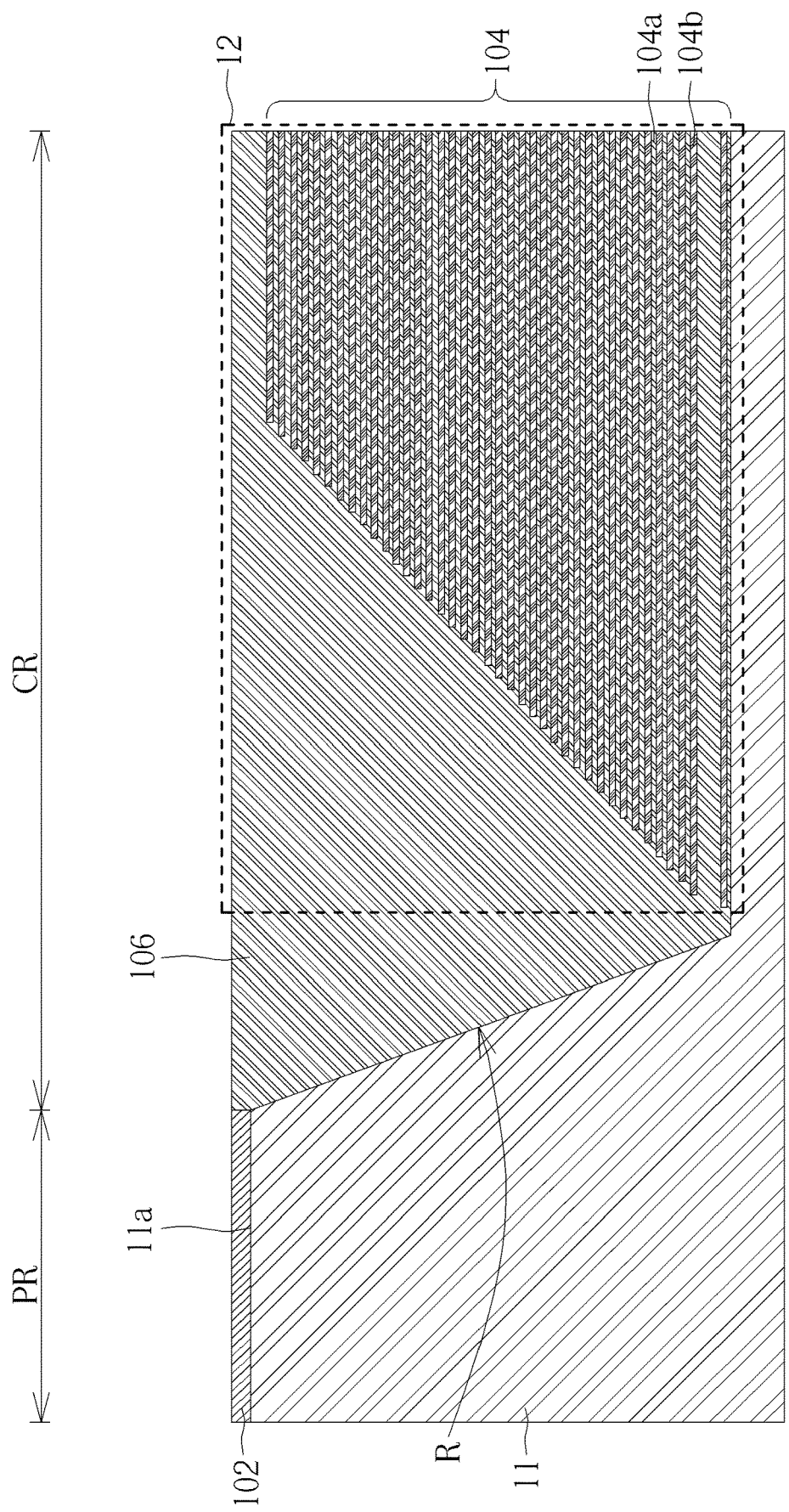

In the following description, the 3D memory component 12 is the 3D NAND flash memory component as an example. In an example embodiment, as shown in FIG. 5, the method for forming the 3D memory component 12 includes forming an alternating dielectric stack 104 in the recess R, forming a first insulation layer 106 fully on the alternating dielectric stack 104 and the substrate 11, and then fully planarizing the first insulation layer 106. The alternating dielectric stack 104 includes a plurality of first dielectric layers 104a and a plurality of second dielectric layers 104b different from the first dielectric layers 104a, and each first dielectric layer 104a and each second dielectric layer 104b are stacked alternately on the bottom of the recess R. For example, the first dielectric layer 104a includes silicon oxide, and the second dielectric layer 104b includes silicon nitride. Also, the planarization process of the first insulation layer 106 may include for example chemical mechanical polishing (CMP) process or in combination with wet or dry etching process. The first insulation layer 106 may include, but not limited to, silicon oxide or TEOS. In some embodiments, the first insulation layer 106 may extend over the remaining mask layer 102 or not cover the remaining mask layer 102. In some embodiment, the planarization process may planarize the top surface of the first insulation layer 106 and the top surface of the remaining mask layer 102 into the same level.

As shown in FIG. 6, after planarizing the first insulation layer 106, the method forming the 3D memory component 12 may further include forming vertical channel holes through the first insulation layer 106 and the alternating dielectric stack 104, forming NAND strings 108 in the vertical channel holes, and then replacing the second dielectric layers 104b with conductor layers 110a respectively to form a plurality of conductor/dielectric layer pairs. The NAND string 108 may include a semiconductor channel (e.g., a silicon channel) and multiple layers that extend vertically through the conductor/dielectric layer pairs and the first insulation layer 106. The conductor/dielectric layer pairs are also referred to herein as an alternating conductor/dielectric stack 110. The conductor layer 110a may be used as a word line (electrically connected to one or more control gates). The multiple layers may be formed between the alternating conductor/dielectric stack 110 and the semiconductor channel. In some embodiments, the multiple layers may for example include a tunneling layer that the electrons or holes from the semiconductor channel tunnel through, a storage layer for storing charges, and a blocking layer, and the tunneling layer, the storage layer and the blocking layer are sequentially arranged from the semiconductor channel to the alternating conductor/dielectric stack 110. The tunneling layer may include silicon oxide, silicon nitride, or any combination thereof. The storage layer may include silicon nitride, silicon oxynitride, silicon, or any combination thereof. The blocking layer may include silicon oxide, silicon nitride, high dielectric constant (high-k) dielectrics, or any combination thereof. In some embodiments, each NAND string 108 may further include an etch stop plug at an upper end of the semiconductor channel and the multiple layers for protecting dielectrics filled in vertical channel holes, such as silicon oxide and silicon nitride.

In some embodiments, between forming the NAND strings 108 and replacing the second dielectric layers, the method forming the 3D memory component 12 may further include forming gate slit holes (not shown in figures) to penetrate through the first insulation layer 106 and the alternating dielectric stack 104, so the second dielectric layers 104b can be exposed, and then, the second dielectric layers 104b can be replaced with the conductor layers 110a to form the alternating conductor/dielectric stack 110. Later, gate slit structures (not shown in figures) are formed in the gate slit holes, in which each gate slit structure include a conductive material and a dielectric layer between the conductive material and the alternating conductor/dielectric stack 110. The conductive material and the conductor layer may include, but not limited to, tungsten (W), cobalt (Co), copper (Cu), aluminum (Al), polycrystalline silicon (polysilicon), doped silicon, silicides, or any combination thereof. The dielectric layer may include, but not limited to, silicon oxide, silicon nitride, silicon oxynitride, or any combination thereof. It is noted that based on the type of the 3D memory component 12, the method for forming the 3D memory component 12 may be different. The method for forming the 3D memory component 12 mentioned above is only for an example, but not limited thereto.

As shown in FIG. 2 and FIG. 7, after step S102, the method proceeds to step S103, in which a peripheral circuit 13 is formed on the top surface 11a of the substrate 11 outside the recess R. The peripheral circuit 13 may include for example any suitable digital, analog, and/or mixed-signal peripheral circuits used for facilitating the operation of the 3D memory component 12, such as page buffers, decoders, and latches. In step S103, the method for forming the peripheral circuit 13 may adopt any kind of methods for forming transistors, such as field-effect transistor (FET) or other suitable transistors. For example, the formation of the peripheral circuit 13 may include sequentially forming high-voltage (HV) p-type well and HV n-type well, HV gate oxide layer, shallow trench isolation, lower-voltage (LV) p-type well and LV n-type well, LV gate oxide layer, polysilicon, tungsten silicide, drain regions and source regions, and a protection layer 112. The protection layer 112 may be used for protecting the devices thereunder for instance. In some embodiments, a part of the remaining mask layer 102 may be removed to form the shallow trench isolation, and then, the remaining mask layer 102 is fully removed. Alternatively, a part of the mask layer 102 may be used as the gate oxide layer of some transistors. It is noted that based on the design of the peripheral circuit 13, the method for forming the peripheral circuit 13 may be different. The method for forming the peripheral circuit 13 mentioned above is only for an example, but not limited thereto. The method for forming the peripheral circuit 13 may be performed based on normal CMOS manufacturing technology, so the method is not detailed herein.

After the peripheral circuit 13 is formed, the method for forming the 3D memory structure 10 may further include forming a second insulation layer 114 fully on the peripheral circuit 13 and the first insulation layer 106 and then planarizing the second insulation layer 114. The planarization process of the second insulation layer 114 may include for example chemical mechanical polishing (CMP) process. The second insulation layer 114 may include, but not limited to, include, but not limited to, silicon oxide, silicon nitride, silicon oxynitride, or any combination thereof. In some embodiments, after planarization of the second insulation layer 114, the method may further include forming a plurality of word line contacts 118, a plurality of NAND string contacts 120, and a plurality of gate slit structure contacts (not shown) for being electrically connected to the 3D memory component. The word line contacts 118 penetrate through the second insulation layer 114 and the first insulation layer 106 and each of which is in contact with the corresponding conductor layer 110a. The NAND string contacts 120 are disposed on the NAND strings 108 respectively. The gate slit structure contacts extend through the second insulation layer 114, the first insulation layer 106 and the alternating conductor/dielectric stack 110. These contacts may also include W, Cu, Al, or any other suitable materials.

As shown in FIG. 8, after the second insulation layer 114 is formed, a metal connection layer 14 is formed on the second insulation layer 114, thereby forming the 3D memory structure 10 of the example embodiment. The metal connection layer 14 is used for electrically connecting the peripheral circuit 13 to the 3D memory component 12 and/or electrically connecting the 3D memory component 12 and the peripheral circuit 13 to the other devices or circuits. The metal connection layer 14 may include for example via contacts and/or bonding pads for example. In some embodiments, one or more interconnection layer 116 may be formed and disposed between the metal connection layer 14 and the peripheral circuit 13 and disposed between the metal connection layer 14 and the word line contacts 118, the NAND string contacts 120 and the gate slit structure contacts, such that the peripheral circuit 13 may be electrically connected to the 3D memory component 12 through the metal connection layer 14 and the above-mentioned contacts. In some embodiments, the interconnection layer 116 can include a plurality of metal layers, in which one or more of the metal layers include tungsten (W), copper (Cu), aluminum (Al), or any other suitable materials. The method may include forming a plurality of transistor contacts 122 through the second insulation layer 114 and a part of interconnection layer 116 for electrically connects the peripheral circuits 13 to the metal connection layer 14 after a part of the interconnection layer 116 is formed. Alternatively, the transistor contacts 122 may be formed between planarizing the second insulation layer 114 and forming the interconnection layer 116. The forming processes of the contacts and the interconnection layer 116 mentioned above are only for an example, but not limited thereto. The formation of the contacts and the interconnection layer 116 may be adjusted according to the design requirement.

It is noted that in the formation of the 3D memory structure 10 of the example embodiment, the 3D memory component 12 may be defined as the component formed before forming the peripheral circuit 13, so the high-temperature processes in the formation of the 3D memory component 12 cannot affect the formation of the peripheral circuit 13, and the damage or adversely affection to the peripheral circuit 13 can be avoided. For example, the 3D memory component 12 may include core components except the contacts that are formed after forming the peripheral circuit 13 for connecting the core components to the peripheral circuit 13. The formation of the core components may for example include introducing hydrogen plasma gas. If the core components are formed after forming the peripheral circuit 13, the hydrogen plasma gas will be diffused into and enter the peripheral circuit 13 during the high-temperature processes in the formation of the 3D memory component 12. Thus, through forming the 3D memory component 12 before forming the peripheral circuit 13, the electrical characteristic of the devices in the peripheral circuit 13 can be prevented from being adversely affected by the high-temperature processes, thereby increasing the product yield and reducing product cost. Also, since the 3D memory component 12 is formed in the recess R and the peripheral circuit 13 is formed on the top surface 11a of the substrate 11, the formation of the peripheral circuit 13 doesn't affect the formed 3D memory component 12, thereby simplifying the method for forming the 3D memory structure 10. Besides, the spacing between the 3D memory component 12 and the peripheral circuit 13 may be accordingly increased. Since the spacing is increased, the remaining hydrogen gas that is introduced in the 3D memory component 12 during the formation of the 3D memory component 12 is not easily diffused to the peripheral circuit 13 during the high-temperature processes of the peripheral circuit 13, and the electrical characteristic of the peripheral circuit 13 can also be prevented from being adversely affected by the high-temperature processes. In some embodiments, the core components may include the NAND strings 108, the alternating conductor/dielectric stack 110 and other components in the substrate 11 under the recess R (for example doped regions in the substrate 11 for being electrically connected to the gate slit structures). Also, since a thickness of the 3D memory component 12 is greater than a thickness of the peripheral circuit 13, if the 3D memory component 12 and the peripheral circuit 13 are directly formed on the substrate 11 without recess R, the 3D memory component 12 formed after forming the peripheral circuit 13 may be easily damaged by the planarization process in the formation of the peripheral circuit 13. For this reason, the recess R that is formed on the substrate 11 before forming the 3D memory component 12 can inhibit the damage of the planarization process to the formed 3D memory component 12.

In some embodiments, for preventing the planarization of the second insulation layer 114 from damaging the 3D memory component 12, the thickness of the 3D memory component 12 may be less than or equal to a sum of a depth of the recess R and the thickness of the peripheral circuit 13. For example, top surfaces of the NAND strings 108 are lower than or equal to the top of the peripheral circuit 13. Also, in some embodiments, for inhibiting the planarization processes in the formation of the peripheral circuit 13 from damaging the 3D memory component 12, a depth of the recess R may be greater than or equal to a thickness of the 3D memory component 12. For example, top surfaces of the NAND strings 108 may be lower than or equal to the top surface 11a of the substrate 11 outside the recess R.

The present invention also provides a 3D memory device, in which the 3D memory structure 10 is disposed. The 3D memory device is formed by packaging the 3D memory structure, and has bus interface, such as SATA, M.2, PCI-E, or mSATA, for communicating with other electronic devices. Since the 3D memory device includes the 3D memory structure 10, the 3D memory device also has the same benefit as the 3D memory structure 10 that is mentioned above.

The present invention also provides an electronic apparatus, in which the 3D memory device is disposed. The electronic apparatus may be any kind of apparatuses capable of storing data, such as cellphone, desktop computer, tablet computer, notebook, or server. Since the electronic apparatus includes the 3D memory structure 10, the electronic apparatus also has the same benefit as the 3D memory structure 10 that is mentioned above.

As mentioned above, in the method for forming the 3D memory structure of the present invention, the 3D memory component is formed before the formation of the peripheral circuit and is formed in the recess, so the hydrogen plasma gas introduced in the formation of the 3D memory component will not affect the peripheral circuit, thereby preventing the electrical characteristic of the devices in the peripheral circuit 13 from being adversely affected by the high-temperature processes. Accordingly, the product yield of the formed 3D memory structure can be increased, and the product cost can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a three-dimensional (3D) memory structure, comprising:
    forming a recess on a substrate;
    forming a 3D memory component with a bottom located in the recess, wherein forming the 3D memory component comprises:
        forming an alternating dielectric stack, wherein the alternating dielectric stack comprises a plurality of first dielectric layers and a plurality of second dielectric layers different from the first dielectric layers, and each first dielectric layer and each second dielectric layer are stacked alternately;
        forming a first insulation layer fully on the alternating dielectric stack; and
        fully planarizing the first insulation layer;
        forming a plurality of NAND strings through the alternating dielectric stack after planarizing the first insulation layer, wherein the NAND strings extend through the first insulation layer; and
        replacing the second dielectric layers with a plurality of conductor layers respectively to form an alternating conductor/dielectric stack, wherein the 3D memory component comprises the alternating conductor/dielectric stack and the NAND strings penetrating through the alternating conductor/dielectric stack;

forming a peripheral circuit on the substrate outside the recess after forming a whole of the 3D memory component;
forming a second insulation layer fully on the peripheral circuit and the first insulation layer;
fully planarizing the second insulation layer;
forming an interconnection layer on the second insulation layer, wherein the peripheral circuit is electrically connected to the 3D memory component through the interconnection layer; and
forming a metal connection layer on the interconnection layer, wherein the metal connection layer comprises a bonding pad.

2. The method for manufacturing the 3D memory structure of claim 1, wherein forming the recess comprises:
etching the substrate by using an etching process to form the recess, wherein a depth of the recess is greater than or equal to a thickness of the 3D memory component.

3. The method for manufacturing the 3D memory structure of claim 1, further comprising forming a plurality of word line contacts through the first insulation layer after the peripheral circuit is formed.

* * * * *